(12) United States Patent
Naganuma et al.

(10) Patent No.: US 9,101,075 B2
(45) Date of Patent: Aug. 4, 2015

(54) SUBSTRATE WITH BUILT-IN COMPONENT

(71) Applicant: Taiyo Yuden Co., Ltd., Tokyo (JP)

(72) Inventors: Masaki Naganuma, Tokyo (JP); Kazuaki Ida, Gunma (JP); Tatsuro Sawatari, Tokyo (JP); Hiroshi Nakamura, Tokyo (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 0 days.

(21) Appl. No.: 14/101,026

(22) Filed: Dec. 9, 2013

(65) Prior Publication Data

US 2015/0070862 A1 Mar. 12, 2015

(30) Foreign Application Priority Data

Sep. 12, 2013 (JP) ................................. 2013-189176

(51) Int. Cl.
H05K 1/18 (2006.01)

(52) U.S. Cl.
CPC ................ H05K 1/186 (2013.01); H05K 1/185 (2013.01)

(58) Field of Classification Search
USPC ........... 361/760–803, 792–795; 174/260–262
See application file for complete search history.

(56) References Cited

U.S. PATENT DOCUMENTS

| 8,314,343 | B2* | 11/2012 | Inoue et al. | 174/260 |
| 8,536,959 | B1* | 9/2013 | Mugiya et al. | 333/186 |
| 2004/0049912 | A1 | 3/2004 | Akagawa et al. | |
| 2009/0205202 | A1 | 8/2009 | Tanaka et al. | |
| 2010/0084175 | A1* | 4/2010 | Suzuki et al. | 174/260 |
| 2011/0203836 | A1* | 8/2011 | Yokota et al. | 174/250 |

FOREIGN PATENT DOCUMENTS

| JP | 2004-096058 A | 3/2004 |
| JP | 2009-152415 A | 7/2009 |
| JP | 2009-194382 A | 8/2009 |
| JP | 4638657 B2 | 12/2010 |
| JP | 2013-058619 A | 3/2013 |

* cited by examiner

Primary Examiner — Jenny L Wagner
Assistant Examiner — Ahmad D Barnes
(74) Attorney, Agent, or Firm — Fitch Even Tabin & Flannery LLP

(57) ABSTRACT

There is provided a substrate with built-in component, including a metal core layer having a cavity for storing a component; a wiring layer that is laminated on the core layer and has a plurality of vias for an interlayer connection, the vias being formed at regions opposing to the cavity; and an electronic component including a plurality of terminals electrically connected to the plurality of vias, and a component body that is stored in the cavity and has a support surface for supporting the plurality of terminals, the plurality of terminals being disposed eccentrically from a center of the support surface to a first direction, and the component body being disposed eccentrically from a center of the cavity to a second direction opposite to the first direction.

2 Claims, 3 Drawing Sheets

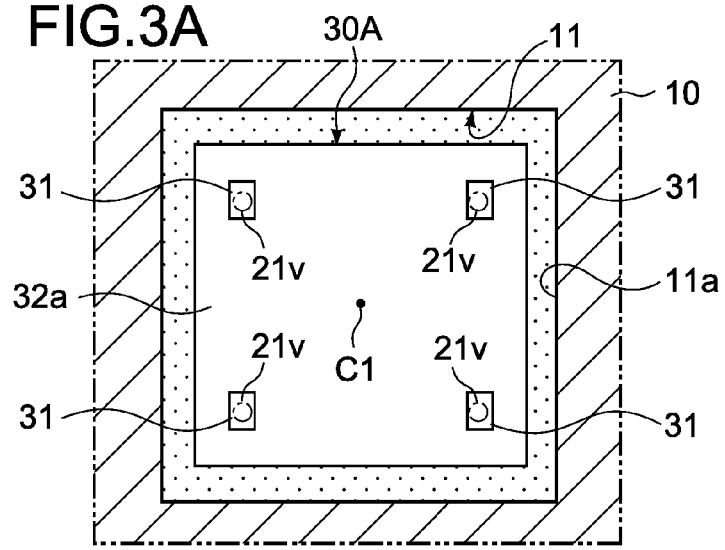
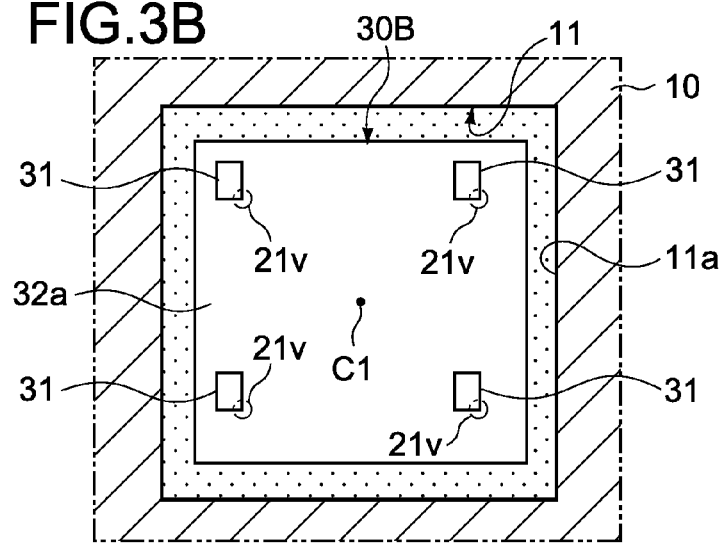
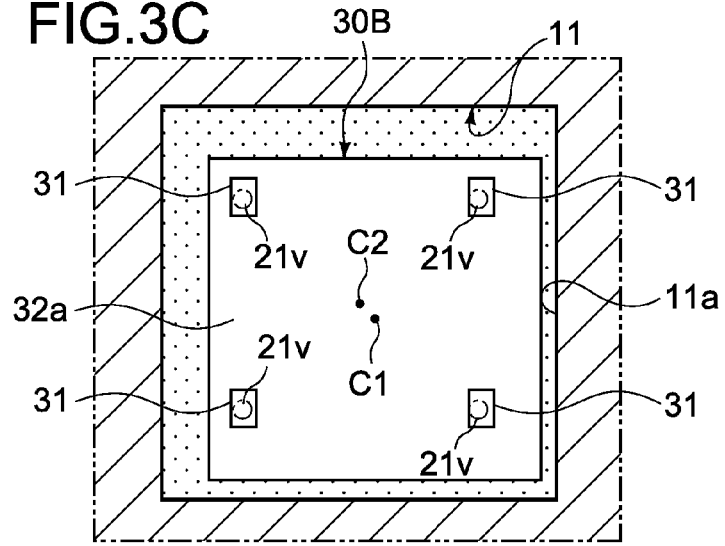

SUBSTRATE WITH BUILT-IN COMPONENT

CROSS-REFERENCE TO A RELATED APPLICATION

This application claims priority under 35 U.S.C. §119 to Japanese Patent Application No. JP 2013-189176 filed on Sep. 12, 2013, the entire content of which is hereby incorporated herein by reference in its entirety.

FIELD

The present disclosure relates to a substrate with built-in component having a cavity in which an electronic component is stored.

BACKGROUND

By using a substrate with built-in component, a packaging density can be increased and the substrate can be smaller than a conventional component-mounted substrate. This contributes to small and thin mobile devices such as a mobile phone, a mobile electronic dictionary and a digital camera.

SUMMARY

For example, Japanese Patent No. 4638657 discloses a multilayer substrate with built-in electronic component having a metal core substrate including a cavity in which the electronic component is stored. The multilayer substrate has a core substrate, an electronic component stored in the cavity of the core substrate and sealed with an insulating resin, and a transition layer formed on an insulating resin film covering an upper surface of the electronic component. The transition layer functions as a via for connecting layers to connect a plurality of terminals formed on the upper surface of the electronic component to a conductor circuit of an upper layer via the insulating resin film.

After a plurality of holes for exposing respective terminals on the upper surface of the electronic component are formed in the insulating resin film that covers the electronic component within the cavity, the holes are filled with a metal material such as copper by a plating method etc., thereby forming the transition layer. Typically, the plurality of terminals for exposing the terminals are formed by etching or laser processing using a predetermined mask. Accordingly, the electronic component stored in the cavity is disposed within the predetermined position of the cavity (for example, a center position of the cavity) such that the terminal groups on the upper surfaces are arranged at aperture positions of the mask.

Most of the electronic component is produced by forming a plurality of elements on one substrate and then cutting them into each component size. So, the plurality of components produced from one substrate has normally the same configuration, and the positions of the terminals are the same in each component. On the other hand, for example in the electronic devices composed of a ceramic material, deformation or shrinkage of the substrate caused by a firing processing may vary the positions of the terminals within a plane of the substrate (per element region). As long as such a variation of the positions at the terminals is within a certain range, a corresponding state between the aperture positions of the mask and the terminals can be maintained, and it is therefore possible to adequately connect interlayers. The greater the substrate size is and the smaller the electronic components are, such a problem will become apparent.

However, once the variation of the positions at the terminals exceeds the above-described certain range, the corresponding state between the aperture positions of the mask and the terminals cannot be maintained, and it is therefore impossible to adequately connect interlayers, even if the component is mounted at the predetermined position in the cavity. The greater the substrate size is and the smaller the electronic component is, such a problem will become apparent. There is no description about a solution the problem in Japanese Patent No. 4638657.

In view of the above-described circumstances, it is desirable to provide a substrate with built-in component to ensure the interlayer connection to the terminals of the built-in components.

According to an embodiment of the present disclosure, there is provided a substrate with built-in component including a metal core layer, a wiring layer and at least one electronic component.

The core layer has a cavity for storing the component.

The wiring layer is laminated on the core layer. In the wiring layer, a plurality of vias for an interlayer connection are formed at regions opposing to the cavity.

The electronic component includes a plurality of terminals electrically connected to the plurality of vias, and a component body that is stored in the cavity and has a support surface for supporting the plurality of terminals. The plurality of terminals are disposed eccentrically from a center of the support surface to a first direction, and the component body is disposed eccentrically from a center of each cavity to a second direction opposite to the first direction.

These and other objects, features and advantages of the present disclosure will become more apparent in light of the following detailed description of best mode embodiments thereof, as illustrated in the accompanying drawings.

BRIEF DESCRIPTION OF THE DRAWINGS

FIG. 3A is a plan view showing a relationship between a cavity and an electronic component in the substrate with built-in component according to the first embodiment;

FIG. 3B is a plan view showing a relationship between a cavity and an electronic component in the substrate with built-in component according to the first embodiment;

FIG. 3C is a plan view showing a relationship between a cavity and an electronic component in the substrate with built-in component according to the first embodiment;

DETAILED DESCRIPTION OF EMBODIMENTS

According to an embodiment of the present disclosure, a substrate with built-in component includes a metal core layer, a wiring layer and at least one electronic component.

The core layer has a cavity for storing the component.

The wiring layer is laminated on the core layer. In the wiring layer, a plurality of vias for an interlayer connection are formed at regions opposing to the cavity.

The electronic component includes a plurality of terminals electrically connected to the plurality of vias, and a component body that is stored in the cavity and has a support surface for supporting the plurality of terminals. The plurality of terminals is disposed eccentrically from a center of the support surface to a first direction, and the component body is disposed eccentrically from a center of each cavity to a second direction opposite to the first direction.

In the substrate with built-in component, when the plurality of terminals are disposed eccentrically from the center of the support surface on the component body, the component body is disposed eccentrically from the center of the cavity in a direction opposite to a shift direction of the terminals. In this way, the plurality of terminals are disposed at preliminarily specified positions where vias are formed, thereby forming the vias adequately.

Typically, the cavity has a first aperture having an approximate rectangular shape. In this case, the support surface has an approximate rectangular planar shape, the plurality of terminals are disposed along a peripheral of the support surface. The plurality of terminals may be disposed at four corners of the support surface, or along four sides of the support surface.

The material of the component body is not especially limited, and may be a semiconductor material or a ceramic material. In particular, the ceramic material may change its volume by the firing processing, and a layout of the terminals may be varied. In such a case, the plurality of terminals can be disposed adequately at the positions where the vias are formed.

The cavity may have a plurality of second apertures formed at four corners of the first aperture and protruded outward from the four corners.

In this way, a clearance can be provided between the electronic component disposed eccentrically from the center to one side of the cavity and the corners of the cavity. Lowering a mounting workability and an insulation failure can be avoided.

Hereinafter, referring to Drawings, preferable embodiments of the present disclosure will be described.

First Embodiment

Figure 1:
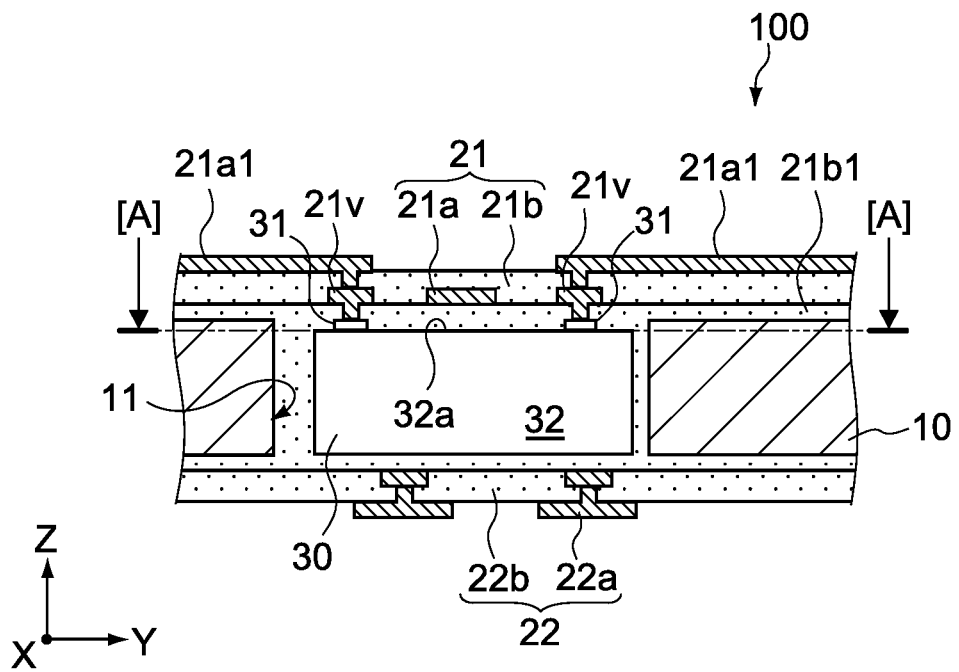
FIG. 1 is a schematic a sectional side view showing a substrate with built-in component according to a first embodiment of the present disclosure.
Figure 2:
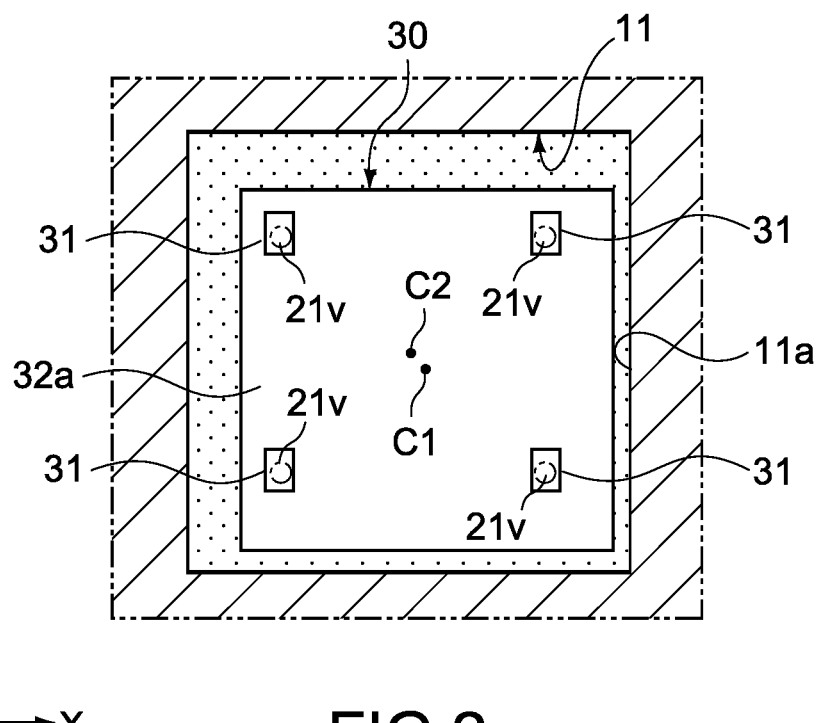
FIG. 2 is a sectional view along the [A]-[A] line in FIG. 1.

FIG. 1 is a schematic a sectional side view showing a substrate with built-in component according to a first embodiment of the present disclosure. FIG. 2 is a sectional view along the [A]-[A] line in FIG. 1.

In each view, an X direction, a Y direction and a Z direction are orthogonal to each other. For ease of understanding, a configuration of each member is exaggerated, and a size of each member and a ratio of members in each view are not necessarily corresponded.

A substrate 100 with built-in component according to a first embodiment includes a metal core layer 10 having a cavity 11 for storing a component, a first and second wiring layers 21 and 22 laminated on the core layer 10, and an electronic component 30 stored in the cavity 11.

A thickness and a shape of the core layer 10 are not especially limited. For example, the core layer 10 has a thickness such that the electronic component 30 can be stored, and is typically an approximate rectangular shape. The core layer 10 can be made of a conductive material such as copper, a copper alloy and the like. The core layer 10 has functions to increase stiffness of the substrate with built-in component, protect the electronic component 30, increase a heat releasing property and work as a part of the wiring (for example, as a ground wiring).

The cavity 11 is formed in an adequate size such that the electronic component 30 can be stored. The cavity 11 is a penetrating hole passing though the core layer 10, but is not limited thereto, and may be formed as a concave portion having a bottom. The cavity 11 has an aperture 11a (a first aperture) having an aperture shape of approximate square (rectangle). The aperture 11a may be a polygonal, a circle, an oval or a combination of thereof other than the rectangle. Also, the cavity 11 is not limited to singular. A plurality of the cavities 11 may be formed in the core layer 10.

The first wiring layer 21 is laminated on the upper surface of the core layer 10, and the second wiring layer 22 is laminated on the lower surface of the core layer 10. Each of the first and second wiring layers 21 and 22 is configured of the multilayer substrate where conductor layers 21a and 22a and insulating layers 21b and 22b are laminated alternately. The conductor layers 21a and 22a are each composed of a metal material, a conductive paste or the like, and typically of a copper foil. The insulating layers 21b and 22b are each composed of a synthetic resin material such as a BT resin (bismaleimide triazine resin) or a glass epoxy-based material, but it is not limited thereto.

The first wiring layer 21 has a plurality of vias 21v for connecting interlayers. The vias 21v are disposed at the regions opposing to the cavity 11, and electrically connect a plurality of terminals 31 of electronic components 30 and conductor layers 21a1. The vias 21v are formed by forming holes penetrating an insulating layer 21b1 by etching or laser processing using a predetermined mask, and coating the holes with a conductor plating, or filling the holes with the conductive material.

The plurality of vias 21v are formed at predetermined positions of the insulating layer 21b1 covering the upper surface of the core layer 10. The predetermined positions may be directly above the respective terminals 31 of the electronic component 30 stored in the cavity 11, and are preliminarily specified irrespective of actual positions of the terminals 31.

The electronic component 30 has a plurality of terminals 31 electrically connected to the plurality of vias 21v, and a component body 32 stored in the cavity 11. The component body 32 has a support surface 32a supporting the plurality of terminals 31. In the first embodiment, the support surface 32a forms the upper surface of the component body 32.

Examples of the electronic component include a capacitor, an inductor, a resistor, a filter chip, an integrated circuit component such as an IC and the like. In the first embodiment, the electronic component 30 has the component body 32 composed of a ceramic material such as a ferromagnetic material, and the plurality of terminals arranged in an array on one main surface, and may be a filter chip such as a SAW filter, a duplexer, or the like, for example.

The electronic component 30 used in the first embodiment is produced by cutting out from an aggregate substrate into a component size. Thus, each component has basically the same configuration, and a relative position of each terminal to the support surface of each component is generally the same. On the other hand, when the component body 32 is composed of the ceramic material, the substrate is deformed or contracted by the firing processing and the positions of the terminals may be easily varied within the substrate (per element region).

As described above, the respective electronic components cut out from the substrate into the component size will include the terminals disposed and not disposed on the normal positions (design positions) of the support surface. As long as such a variation of the positions at the terminals is within a certain range, when the component is mounted on a reference position of the cavity, a corresponding state between the aperture positions of the mask and the terminals can be maintained, and it is therefore possible to adequately connect interlayers.

FIG. 3A is a plan view of an electronic component 30A having the respective terminals 31 disposed on the normal positions of the support surface 32a mounted on the reference position of the cavity 11 (a center position of the cavity in this embodiment). The respective terminals 31 are disposed along a peripheral of the support surface 32a. In this embodiment, the respective terminals 31 are disposed at the positions corresponding to four corners of the support surface having an approximate rectangular planar shape. For example, the normal positions are defined that the respective terminals are disposed rotationally symmetric at a center C1 of the support surface 32a. The vias 21v are disposed corresponding to the positions of the respective terminals 31, and each has a diameter smaller than the size of each terminal 31.

On the other hand, when the variation of the positions at the terminals exceeds the certain range, the corresponding state between the aperture positions of the mask and the terminals cannot be maintained, and it is therefore impossible to adequately connect interlayers, even if the component is mounted on the reference position of the cavity. The greater the substrate size is and the smaller the electronic component is, such a problem will become apparent.

FIG. 3B is a plan view of an electronic component 30B mounted on the reference position of the cavity 11 having the respective terminals 31 not disposed on the normal positions of the support surface 32a. In this embodiment, the respective terminals 31 are disposed not rotationally symmetric at the center C1 of the support surface 32a, but are disposed eccentrically obliquely upward to the left from the center C1, as shown in FIG. 3B. In this case, the respective terminals 31 may not be stably contacted with the vias 21v, which may lead to poor interlayer connection.

In this embodiment, upon mount of the electronic component 30B to the cavity 11, a relative positional relationship between the cavity 31 and the component body 32 is evaluated. When the terminals 31 are not disposed at the normal positions, the electronic component 30B is mounted to the cavity 11 such that the respective terminals 31 correspond to the positions where the vias 21v are formed. As a result, the respective terminals 31 can be stably contacted with the vias 21v. This allows an interlayer connection to have high reliability.

FIG. 3C is a plan view of the electronic component 30B mounted at an eccentric position obliquely downward to the right from the reference position (a center C2) of the cavity 11, and corresponds to FIG. 2. In the electronic component 30 shown in FIG. 2, the plurality of terminals 31 are disposed eccentrically from the center C1 of support surface 32a to a first direction (obliquely upward to the left in this embodiment), and the component body 32 is disposed eccentrically from the center C2 of the cavity 11 to a second direction opposite to the first direction (obliquely downward to the right in this embodiment).

An offset amount of the component body 32 from the reference position (the center C2) of the cavity 11 is similar or almost similar to an offset amount of the terminal 31 from the normal position (the center C1) on the support surface 32a. The offset amount of the component body 32 is not limited thereto, and can be set as appropriate depending on a size of the terminal 31, a via diameter of the via 21v, an outer shape of the component body 32, a size of the cavity 11 and the like.

The offset amount of the terminal 31 can be determined by taking a picture of a mounting surface (the support surface 32a of the component body 32) when the electronic component 30 is mounted to the cavity 11, and acquiring an amount of deviation from the normal position of the support surface 32a in an X-Y coordinate.

When the component body 32 is mounted offset from the reference position, an adequate clearance is desirably provided so that the component body 32 is not contacted with an inner wall of the cavity 11. This prevents an electrical short between the component body 32 and the metal core layer.

The size of the cavity 11 can be set depending on a positional accuracy of the terminal 31 to the component body 32.

In other words, when the position of the terminal 31 is easily deviated to the support surface 32a of the component body 32 in the course of production of the component, there is a possibility that the component should be mounted to the cavity in a relatively large offset amount. In order to avoid a contact between the component and the inner wall of the cavity 11, the relatively large cavity 11 is desirably formed.

On the other hand, when the position of the terminal 31 is not easily deviated to the support surface 32a of the component body 32 in the course of production of the component, there is a high possibility that the component can be mounted on the reference position. The relatively small cavity 11 can be formed.

As described above, the size of the cavity 11 can be set depending on a positional accuracy of the terminal of the component, whereby the cavity 11 can be laid out effectively and the substrate 100 with built-in component can be small.

Second Embodiment

Figure 4A:
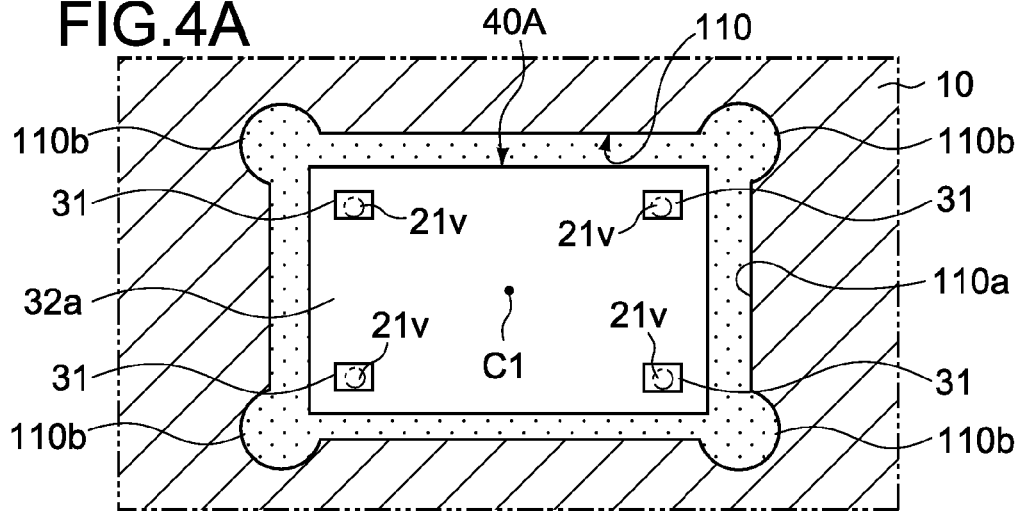
FIG. 4A is a plan view showing a relationship between a cavity and an electronic component in the substrate with built-in component according to a second embodiment.
Figure 4B:
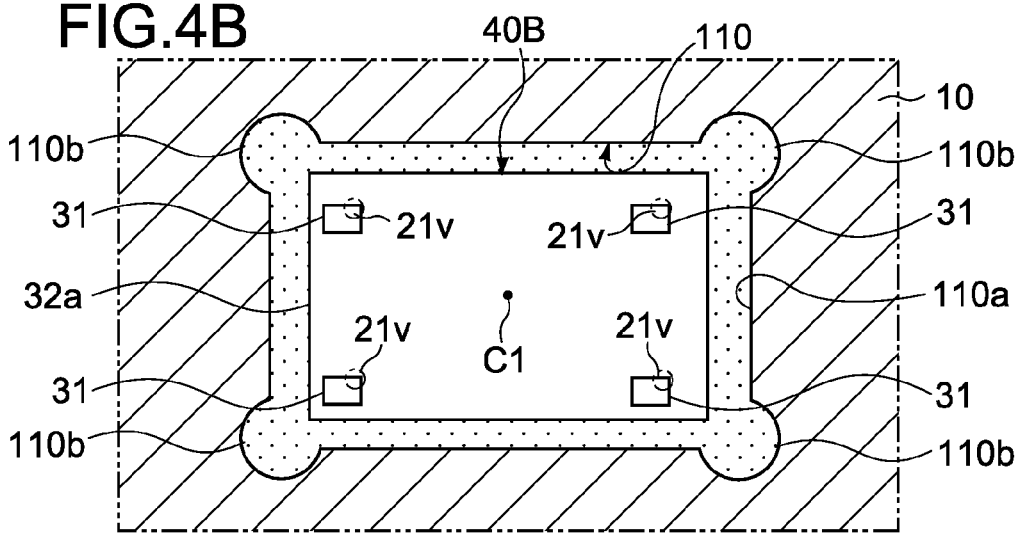
FIG. 4B is a plan view showing a relationship between a cavity and an electronic component in the substrate with built-in component according to the second embodiment.
Figure 4C:
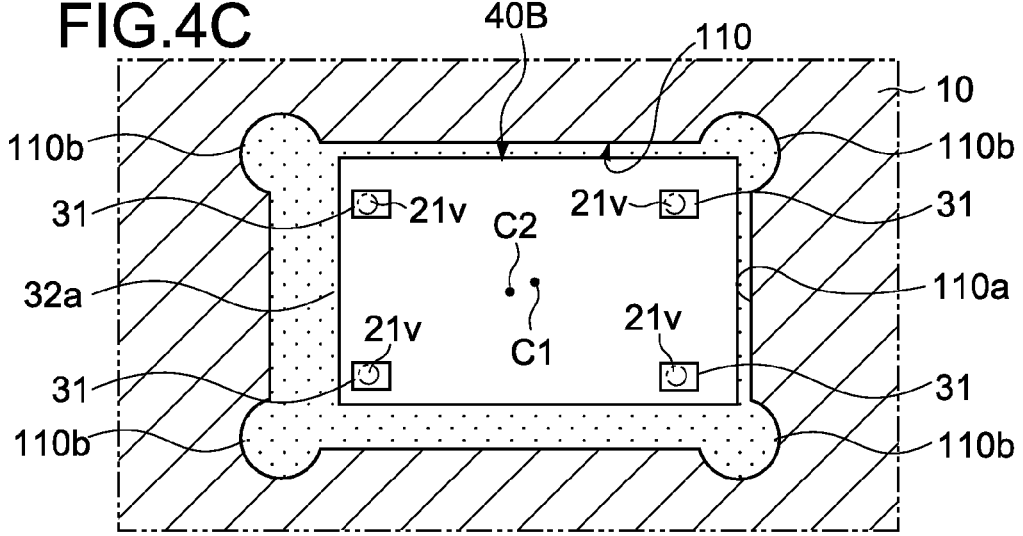
FIG. 4C is a plan view showing a relationship between a cavity and an electronic component in the substrate with built-in component according to the second embodiment.

FIGS. 4A to 4C each is a plan view showing a relationship between a cavity and an electronic component in a substrate with built-in component according to a second embodiment. Hereinafter, only points different from the first embodiment will be mainly described, members already described are denoted by the same reference numerals, and thus detailed description thereof will be hereinafter omitted.

The substrate with built-in component in the second embodiment has a different configuration of the cavity 110 formed on the core layer 10 from the first embodiment. According to the second embodiment, the cavity 110 for storing an electronic component 40 includes a first aperture 110a having a rectangular shape and a plurality of second apertures 110b formed at four corners of the first aperture 110a. These second apertures 110b are formed to protrude outward from the four corners.

FIG. 4A is a plan view showing that an electronic component 40A having the respective terminals 31 disposed on the normal positions of the support surface 32a is mounted on the reference position of the cavity 110 (a center position of the cavity in this embodiment). The respective terminals 31 are disposed along a peripheral of the support surface 32a. In this embodiment, the respective terminals 31 are disposed at the positions corresponding to four corners of the support surface having an approximate rectangular planar shape. For example, the normal positions are defined that the respective terminals are disposed rotationally symmetric at a center C1 of the support surface 32a. The vias 21v are disposed corresponding to the positions of the respective terminals 31, and each has a diameter smaller than the size of each terminal 31. In this case, when the electronic component 40A is mounted at the reference position of the cavity 110, the corresponding state between the respective terminals 31 and the vias 21v can be maintained, and it is therefore possible to adequately connect the interlayers.

FIG. 4B is a plan view of an electronic component 40B mounted on the reference position of the cavity 110 having the respective terminals 31 not disposed on the normal positions of the support surface 32a. In this embodiment, the respective terminals 31 are disposed not rotationally symmetric at the center C1 of the support surface 32a, but are disposed eccentrically obliquely upward to the left from the center C1, as shown in FIG. 4B. In this case, the respective terminals 31 may not be stably contacted with the vias 21v, which may lead to poor interlayer connection.

In this embodiment, upon mount of the electronic component 40B to the cavity 11, a relative positional relationship between the cavity 31 and the component body 32 is evaluated. When the terminals 31 are not disposed at the normal positions, the electronic component 40B is mounted to the cavity 110 such that the respective terminals 31 correspond to the positions where the vias 21v are formed. As a result, the respective terminals 31 can be stably contacted with the vias 21v. This allows the interlayer connection to have high reliability.

FIG. 4C is a plan view of the electronic component 40B mounted at an eccentric position obliquely upward to the right from the reference position (a center C2) of the cavity 11. In the electronic component 40B, the plurality of terminals 31 are disposed eccentrically from the center C1 of the cavity 110 to a first direction (obliquely downward to the left in this embodiment), and the component body 32 disposed eccentrically from the center C2 of the cavity 110 to a second direction opposite to the first direction (obliquely upward to the right in this embodiment).

As described above, in the second embodiment, it may also be possible to obtain a similar function effect as that in the first embodiment. In the second embodiment, the second apertures 110b are disposed at the four corners of the cavity 110. Even when the electronic component 40B is mounted eccentrically to the four corners, a predetermined clearance can be provided between the corners and the electronic component 40B. In this way, a short circuit failure between the electronic component 40B and the core layer 10 can be overcome.

The first aperture 110a and the second aperture 110b are typically formed at the same time by wet etching predetermined regions of the core layer 10. The planar shape of each second aperture 110b is a partly arc shape having a predetermined diameter, but is not limited thereto, and may be an oval shape, a polygonal shape, or the like. In addition, all of the second apertures 110b may have the same shape and size, or may have different shapes and sizes.

While the present invention is described herein with reference to illustrative embodiments for particular applications, it should be understood that the invention is not limited thereto. Variations and modifications may be made without departing from the spirit and scope of the present disclosure.

For example, according to the above-described embodiments, as the electronic component, the plurality of terminals are disposed respectively at the four corners of the support surface on the component body. This is only an embodiment and is not a limitation of the present disclosure. As the electronic component, the plurality of terminals may be arranged straight along four sides of the support surface.

According to the above-described embodiments, the second wiring layer 22 is laminated on the lower surface of the core layer 10. Instead of the second wiring layer, a heat sink plate may be laminated, for example. This can increase the heat releasing property of the electronic component.

What is claimed is:

1. A substrate with built-in component, comprising:
   a metal core layer having a cavity for storing a component, the cavity being formed by a single aperture;
   a wiring layer that is laminated on the core layer and has a plurality of vias for an interlayer connection, the vias being formed at regions opposing to the cavity; and
   an electronic component including a plurality of terminals electrically connected to the plurality of vias, and a component body that is stored in the cavity and has a support surface for supporting the plurality of terminals, the plurality of terminals being disposed eccentrically from a center of the support surface to a first direction, and the component body being disposed eccentrically from a center of the cavity to a second direction opposite to the first direction;
   wherein the cavity has a first aperture portion having an approximate rectangular shape, the support surface has an approximate rectangular planar shape, the plurality of terminals are disposed along a peripheral of the support surface; and
   the cavity has a plurality of second aperture portions formed at four corners of the first aperture portion and protruded outward from the four corners.

2. The substrate with built-in component according to claim 1, wherein the component body is composed of a ceramic material.

* * * * *